United States Patent
Steger et al.

(10) Patent No.: US 9,196,572 B2
(45) Date of Patent: Nov. 24, 2015

(54) POWER SEMICONDUCTOR MODULE

(71) Applicants: Jürgen Steger, Hiltpolstein (DE); Peter Beckedahl, Oberasbach (DE)

(72) Inventors: Jürgen Steger, Hiltpolstein (DE); Peter Beckedahl, Oberasbach (DE)

(73) Assignee: Semikron Elektronik GmbH & Co., KG, Nürnberg (DE)

(*) Notice: Subject to any disclaimer, the term of this patent is extended or adjusted under 35 U.S.C. 154(b) by 46 days.

(21) Appl. No.: 14/056,830

(22) Filed: Oct. 17, 2013

(65) Prior Publication Data

US 2014/0103519 A1     Apr. 17, 2014

(30) Foreign Application Priority Data

Oct. 17, 2012 (DE) .................. 10 2012 218 868

(51) Int. Cl.
*H01L 23/52* (2006.01)
*H01L 23/482* (2006.01)
*H01L 25/07* (2006.01)
*H01L 23/373* (2006.01)
*H01L 23/538* (2006.01)

(52) U.S. Cl.
CPC .......... *H01L 23/482* (2013.01); *H01L 23/3735* (2013.01); *H01L 23/5385* (2013.01); *H01L 23/5387* (2013.01); *H01L 25/072* (2013.01); *H01L 2224/32225* (2013.01); *H01L 2924/1301* (2013.01); *H01L 2924/1305* (2013.01); *H01L 2924/13055* (2013.01); *H01L 2924/13091* (2013.01)

(58) Field of Classification Search
CPC .............. H01L 23/482; H01L 23/5385; H01L 23/3735; H01L 25/072; H01L 2224/32225; H01L 2924/1305; H01L 2924/1301

USPC .................. 257/500, 502, 734, 691, E23.019, 257/E23.021, 723; 438/133, 141
See application file for complete search history.

(56) References Cited

U.S. PATENT DOCUMENTS 7,042,074 B2 * 5/2006 Gobl ............................ 257/678

FOREIGN PATENT DOCUMENTS

DE          103 55 925 A1     6/2005
DE          20130104522   *   5/2013
EP          2 544 231 A2      1/2013

* cited by examiner

*Primary Examiner* — Jarrett Stark
*Assistant Examiner* — Shahed Ahmed
(74) *Attorney, Agent, or Firm* — The Law Offices of Roger S. Thompson

(57) ABSTRACT

A power semiconductor module comprising a substrate. The power semiconductor module has first and second DC voltage load current connection elements and first and second power semiconductor components. The first and second power semiconductor components are arranged along a lateral first direction of the substrate. The power semiconductor module has a foil composite having a first metallic foil layer and a structured second metallic foil layer and an electrically insulating foil layer arranged between the first and second metallic foil layers. The first power semiconductor component and the second power semiconductor component are electrically conductively connected to the foil composite and to the substrate. The first and second power semiconductor components are arranged on a common side in relation to the first and second DC voltage load current connection elements. The invention provides a power semiconductor module having a particularly low-inductance construction.

16 Claims, 3 Drawing Sheets

POWER SEMICONDUCTOR MODULE

BACKGROUND OF THE INVENTION

1. Field of the Invention

The invention relates to power semiconductor modules.

2. Description of the Related Art

In known power semiconductor modules, generally power semiconductor components, such as power semiconductor switches and diodes, are arranged on a substrate and electrically conductively connected to one another by a conductor layer of the substrate, bonding wires and/or a foil composite. In such devices, the power semiconductor switches are generally transistors, such as IGBTs (Insulated Gate Bipolar Transistor) or MOSFETs (Metal Oxide Semiconductor Field Effect Transistor), or in the form of thyristors.

In such devices, the power semiconductor components are often electrically interconnected to form one or more so-called half-bridge circuits, which are usually used for rectifying and inverting electrical voltages and currents. The substrate is also generally connected to a heat sink, either directly or indirectly.

German Patent No. DE 103 55 925 A1 (also published as U.S. Pat. No. 7,042,074) discloses a power semiconductor module in which power semiconductor components are electrically connected to one another by a foil composite.

In this device, the electrical load-current-carrying connections between the power semiconductor components among one another and between the power semiconductor components and load current connection elements of the power semiconductor module have parasitic inductances which can lead to overvoltages at the power semiconductor components during the operation of the power semiconductor module. A particularly low-inductance construction of the power semiconductor module is desirable in order to minimize the overvoltages.

SUMMARY OF THE INVENTION

It is therefore an object of the invention to provide an improved power semiconductor module having a particularly low-inductance construction.

This object is achieved by a power semiconductor module comprising a substrate which has an insulating material body and an electrically conductive structured conduction layer arranged on the insulating material body. The conduction layer forms conductor tracks which are electrically insulated from one another. A first power semiconductor component having a first and a second load current connection is arranged on a first conductor track and the first load current connection of the first power semiconductor component is electrically conductively connected to the first conductor track. A second power semiconductor component having a first and a second load current connection is arranged on a second conductor track and the first load current connection of the second power semiconductor component is electrically conductively connected to the second conductor track. The power semiconductor module has a first and a second DC voltage load current connection element. The first and second power semiconductor components are arranged along a lateral first direction of the substrate and the first and second DC voltage load current connection elements are arranged one behind the other. The power semiconductor module has a foil composite with a first metallic foil layer and a structured second metallic foil layer and an electrically insulating foil layer arranged between the first and second metallic foil layers. The second load current connection of the first power semiconductor component is electrically conductively connected to the second metallic foil layer and the second metallic foil layer is electrically conductively connected to the second conductor track. The second load current connection of the second power semiconductor component is electrically conductively connected to the first metallic foil layer. The first DC voltage load current connection element is electrically conductively connected to the first conductor track and the second DC voltage load current connection element is electrically conductively connected to the first metallic foil layer. The first and second power semiconductor components are arranged on a common side in relation to the first and second DC voltage load current connection elements.

It proves to be advantageous if the first and second DC voltage load current connection elements are arranged along the lateral first direction of the substrate and the first and second DC voltage load current connection elements are arranged one behind the other along the first direction of the substrate, wherein the first and second power semiconductor components are arranged along the first direction of the substrate on a common side in relation to the first and second DC voltage load current connection elements. This enables a particularly low-inductance realization of the power semiconductor module.

It also proves to be advantageous if the first and second power semiconductor components are embodied as power semiconductor switches, since this constitutes a customary embodiment of the first and second power semiconductor components.

Furthermore, it proves to be advantageous if a third power semiconductor component having a first and a second load current connection is arranged on the first conductor track and the first load current connection of the third power semiconductor component is electrically conductively connected to the first conductor track, and a fourth power semiconductor component having a first and a second load current connection is arranged on the second conductor track and the first load current connection of the fourth power semiconductor component is electrically conductively connected to the second conductor track. The third and fourth power semiconductor components are arranged along the first direction of the substrate, and the second load current connection of the third power semiconductor component is electrically conductively connected to the second metallic foil layer. The second load current connection of the fourth power semiconductor component is electrically conductively connected to the first metallic foil layer. The first, second, third and fourth power semiconductor components are arranged on a common side in relation to the first and second DC voltage load current connection elements. This enables a low-inductance realization of a technologically customary half-bridge circuit having at least four power semiconductor components.

Furthermore, it proves to be advantageous if the first, second, third and fourth power semiconductor components are arranged along the first direction of the substrate on a common side in relation to the first and second DC voltage load current connection elements. This enables a particularly low-inductance realization of the power semiconductor module.

Furthermore, it also proves to be advantageous if the third and fourth power semiconductor components are diodes, since this constitutes a customary embodiment of the third and fourth power semiconductor components.

It is a further advantageous embodiment of the invention if the first DC voltage load current connection element has a base, in particular running in the first direction of the substrate, and a first section running away from the substrate. In this embodiment, the second DC voltage load current connection element is mechanically connected to the base of the first DC voltage load current connection element via the foil composite, since this enables a particularly closely adjacent arrangement of the first and second DC voltage load current connection elements and, consequently, a particularly low-inductance construction of the power semiconductor module.

In another advantageous embodiment of the invention, the first DC voltage load current connection element has a first section running away from the substrate, and the second DC voltage load current connection element is mechanically connected to the first conductor track via the foil composite. This enables a flexible arrangement of the second DC voltage load current connection element.

In yet another embodiment of the invention, the second DC voltage load current connection element has a first section which runs away from the substrate. In this embodiment, an electrical insulation element is arranged between the first section of the first DC voltage load current connection element and the first section of the second DC voltage load current connection element. This results in a high electrical insulation strength between first and second DC voltage load current connection elements.

In still another embodiment of the invention, the insulation element is embodied in the form of a section of the electrically insulating foil layer, which enables a particularly simple construction of the power semiconductor module.

According to a further advantageous embodiment of the invention, the first DC voltage load current connection element has first pins running away from the substrate and the second DC voltage load current connection element has second pins running away from the substrate. The second pins, in relation to the first pins, in particular in a lateral second direction of the substrate, are arranged in a manner opposite with respect to one another, since this results in a high electrical insulation strength between the first and second DC voltage load current connection elements. For example, external electrical lines can be connected to the first and second DC voltage load current connection elements via the first and second pins.

Furthermore, it proves to be advantageous if the second DC voltage load current connection element is embodied in the form of a section of the first metallic foil layer and the second DC voltage load current connection element is electrically conductively connected to the first metallic foil layer by virtue of the second DC voltage load current connection element being embodied integrally with the first metallic foil layer. In this embodiment, a section of the electrically insulating foil layer is arranged between the first section of the first DC voltage load current connection element and the second DC voltage load current connection element. This measure enables a particularly low-inductance construction of the power semiconductor module, and a particularly simple and particularly space-saving construction of the power semiconductor module.

It is also advantageous if the first and second DC voltage load current connection elements and the first and second power semiconductor components are arranged on a line on the substrate and that line runs in the first direction. This measure results in a particularly low-inductance construction of the power semiconductor module.

We have discovered that it is also advantageous if the extent of the first and second DC voltage load current connection elements and the extent of the foil composite at the second DC voltage load current connection element, in particular in a lateral second direction of the substrate, correspond at least to the extent of the first or of the second, or, if present, of the third or fourth power semiconductor component, in particular in the lateral second direction of the substrate, since this enables a particularly low-inductance construction of the power semiconductor module.

In a further embodiment, a further power semiconductor component of identical type is electrically connected in parallel at least with one of the power semiconductor components and arranged on the substrate. In this embodiment, the extent of the first and second DC voltage load current connection elements and the extent of the foil composite at the second DC voltage load current connection element, in particular in a lateral second direction of the substrate, correspond at least to the distance, in particular in the lateral second direction of the substrate, between the outer edges furthest away from one another of the corresponding power semiconductor component and of the further power semiconductor component of identical type that is electrically connected in parallel. This measure results in a particularly low-inductance construction of the power semiconductor module.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, in which like elements are referenced with like numerals.

DETAILED DESCRIPTION OF THE PRESENTLY PREFERRED EMBODIMENTS

Figure 1:
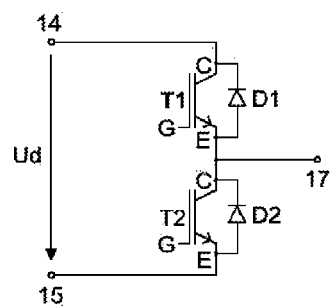
FIG. 1 shows an electrical circuit diagram of a prior art half-bridge circuit.

FIG. 1 shows an electrical circuit diagram of a known half-bridge circuit.

Figure 2:
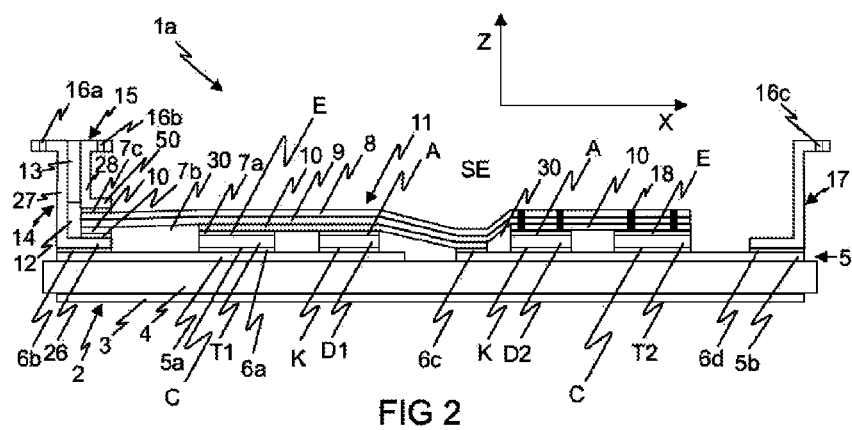
FIG. 2 shows a schematic sectional view of a preferred embodiment of a power semiconductor module according to the invention.
Figure 3:
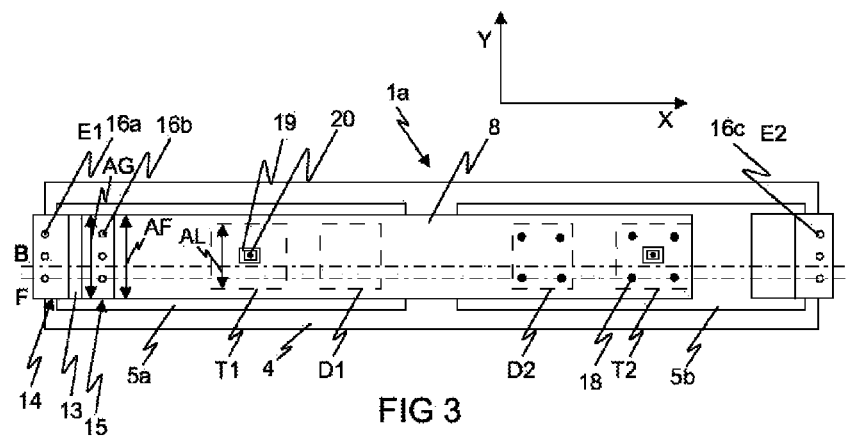
FIG. 3 shows a top view of the embodiment of a power semiconductor module shown in FIG. 2, wherein the sectional view shown in FIG. 2 runs along the line F in FIG. 3.

FIG. 2 illustrates a schematic sectional illustration of an embodiment of a power semiconductor module 1a according to the invention and FIG. 3 illustrates a top view—associated with FIG. 2—of the inventive power semiconductor module 1a, wherein the sectional view illustrated in FIG. 2 runs along the line F illustrated in FIG. 3. It should be noted at this juncture that, in the context of the exemplary embodiment, the known half-bridge circuit illustrated in FIG. 1 is realized in the power semiconductor module 1a, which need not necessarily be the case. In this regard, a plurality of half-bridge circuits, differently designed half-bridge circuits or electrical circuits that are different from a half-bridge circuit can also be realized in the power semiconductor module according to the invention, for example.

Inventive power semiconductor module 1a has a substrate 2, which is present in the form of a DCB substrate in the exemplary embodiment. Substrate 2 has an insulating material body 4 and an electrically conductive structured conduction layer 5 arranged on insulating material body 4, conduction layer 5 forms conductor tracks 5a and 5b which are electrically insulated from one another. Preferably, first substrate 2 has a second electrically conductive, preferably unstructured, conduction layer 3, wherein insulating material body 4 is arranged between structured first conduction layer 5 and second conduction layer 3. Structured first conduction layer 5 of substrate 2 can be made of copper, for example. Substrate 2 can be a DCB substrate, for example, as in the exemplary embodiment, or an insulated metal substrate. In the case of a DCB substrate, first insulating material body 2 can be ceramic, for example, and the second conduction layer of the first substrate can be made of copper, for example. In the case of an insulated metal substrate, first insulating material body 4 may consist of a layer composed of polyimide or epoxy, for example, and second conduction layer 3 of first substrate 2 can be a shaped metal body. The metal shaped body can be made of aluminum or an aluminum alloy, for example.

A first power semiconductor component T1 having a first and a second load current connection C and E, respectively, is arranged on first conductor track 5a and first load current connection C of first power semiconductor component T1 is electrically conductively connected to first conductor track 5a, e.g. by a soldering or sintering layer 6a. It should be noted at this juncture that for the sake of clarity in FIGS. 2, 4, 5 and 6, in the case of the power semiconductor components, only the soldering or sintering layers 6a and 7a by which the first power semiconductor component T1 is connected to other elements are provided with a reference numeral and in FIGS. 4 to 6, with regard to the load current connections of the power semiconductor components, only the first and second load current connections of the first power semiconductor component T1 are provided with a reference numeral. A second power semiconductor component T2 having a first and a second load current connection C and E, respectively, is arranged on second conductor track 5b and first load current connection C of second power semiconductor component T2 is electrically conductively connected to second conductor track 5b, e.g. by a soldering or sintering layer.

In the exemplary embodiment, a third power semiconductor component D1 having first and second load current connections K and A, respectively, is arranged on first conductor track 5a. First load current connection K of third power semiconductor component D1 is electrically conductively connected to first conductor track 5a, e.g. by a soldering or sintering layer. A fourth power semiconductor component D2 having first and second load current connections K and A, respectively, is arranged on the second conductor track 5b and first load current connection K of fourth power semiconductor component D2 is electrically conductively connected to second conductor track 5b, e.g. by a soldering or sintering layer.

The load currents flow through the load current connections, which load currents, in contrast to control currents, can have a high current intensity.

It should be noted that, in the context of the exemplary embodiment, the first and second power semiconductor components are power semiconductor switches and in particular in the form of IGBTs, and the first load current connection C of the respective power semiconductor switch is present in the form of the collector of the respective IGBT and the second load current connection E of the respective power semiconductor switch is present in the form of the emitter of the respective IGBT. In the exemplary embodiment, the control connection G of the power semiconductor switches is present in the form of the gate of the respective IGBT.

Furthermore, it should be noted that, in the context of the exemplary embodiment, the third and fourth power semiconductor components are diodes. The first load current connection K of the respective diode is the cathode of the respective diode and the second load current connection A of the respective diode is the anode of the respective diode.

Furthermore, power semiconductor module 1a has a first and a second DC voltage load current connection element 14 and 15, respectively, wherein the first, second, third and fourth power semiconductor components and the first and second DC voltage load current connection elements 14 and 15 are arranged along a lateral first direction X of the substrate 2 and the first and second DC voltage load current connection elements 14 and 15 are arranged one behind the other along the first direction X of the substrate 2. The first and second DC voltage load current connection elements 14 and 15 preferably serve for the DC voltage load current connection of the power semiconductor module 1a to the outside world, wherein an electrical DC voltage $U_d$ is present between the first and second DC voltage load current connection elements 14 and 15 during the operation of the power semiconductor module 1a.

Power semiconductor module 1a furthermore has a foil composite 11 with a first metallic foil layer 8 and a structured second metallic foil layer 10, and an electrically insulating foil layer 9 arranged between first and second metallic foil layers 8 and 10. The foil layers 8, 9 and 10 are connected to one another, by an adhesive bond, for example. Second metallic foil layer 10 has interruptions 30 on account of its structure, such that second metallic foil layer 10 forms conduction tracks which are electrically insulated from one another. First metallic foil layer 8 can likewise be embodied in a structured fashion. Second load current connection E of first power semiconductor component T1 is electrically conductively connected to second metallic foil layer 10, by a soldering or sintering layer 7a, for example, and second metallic foil layer 10 is electrically conductively connected to second conductor track 5a, by a soldering or sintering layer 6c, for example.

Second load current connection E of second power semiconductor component T2 is electrically conductively connected to first metallic foil layer 8, via a soldering or sintering layer, for example, which electrically conductively connects second load current connection E of second power semiconductor component T2 to second metallic foil layer 10, and via electrically conductive plated-through holes 18, which electrically conductively connect first and second metallic foil layers 8 and 10 to one another.

Second load current connection A of third power semiconductor component D1 is electrically conductively connected to second metallic foil layer 10 by a soldering or sintering layer, for example, and the second load current connection A of the fourth power semiconductor component D2 is electrically conductively connected to first metallic foil layer 8, via a soldering or sintering layer, for example, which electrically conductively connects second load current connection A of fourth power semiconductor component D2 to second metallic foil layer 10, and via electrically conductive first plated-through holes 18, which electrically conductively connect first and second metallic foil layers 8 and 10 to one another. Only one first plated-through hole 18 is provided with a reference sign in the figures, for the sake of clarity.

Second load current connection E of first power semiconductor component T1 is electrically conductively connected to second load current connection A of third power semiconductor component D1 via second metallic foil layer 10 and second load current connection E of second power semiconductor component T2 is electrically conductively connected to second load current connection A of fourth power semiconductor component D2 via second metallic foil layer 10. Second load current connection E of first power semiconductor component T1 and second load current connection A of third power semiconductor component D1 are electrically conductively connected to first load current connection C of second power semiconductor component T2 and to first load current connection K of fourth power semiconductor component D2 via second metallic foil layer 10 and via second conductor track 5b.

Power semiconductor components T1, T2, D1 and D2 are arranged below foil composite 11. These power semiconductor components are not visible from the perspective of FIG. 3, and so are illustrated by dashed lines in FIG. 3.

First DC voltage load current connection element 14 is electrically conductively connected to first conductor track 5a, by a soldering or sintering layer 6b, for example, and second DC voltage load current connection element 15 is electrically conductively connected to first metallic foil layer 8, by a soldering or sintering layer 7c, for example, wherein first, second, third and fourth power semiconductor components T1, T2, D1 and D3 are arranged along first direction X of substrate 2 on a common side SE in relation to first and second DC voltage load current connection elements 14 and 15. In the exemplary embodiment in the illustration in accordance with FIG. 2, first, second, third and fourth power semiconductor components T1, T2, D1 and D2 are arranged in this way to the right of first and second DC voltage load current connection elements 14 and 15. DC voltage load current connection elements 14 and 15 are in this way not arranged between first, second, third and fourth power semiconductor components T1, T2, D1 and D3 along first direction X of substrate 2. Preferably, first and second DC voltage load current connection elements 14 and 15, and first, second, third and fourth power semiconductor components T1, T2, D1 and D3 are arranged along first direction X of substrate 2 on a line B running in the direction of first direction X on substrate 2. Preferably, AC voltage load current connection element 17 is also arranged along first direction X of substrate 2 and in particular preferably arranged on line B running in the direction of first direction X on substrate 2.

A very low-inductance construction of the power semiconductor module according to the invention is achieved as a result of the closely spaced electrical line routing—embodied in a planar fashion—according to the invention of the electrical load currents through the power semiconductor module according to the invention or of the electrical lines carrying positive and negative electrical potentials.

In the context of the exemplary embodiment, first DC voltage load current connection element 14 forms the positive electrical potential load current connection and second DC voltage load current connection element 15 forms the negative electrical potential load current connection of power semiconductor module 1a.

Also in the context of the exemplary embodiment, the power semiconductor module according to the invention has an AC voltage load current connection element 17, which is electrically conductively connected to the second conductor track 5b, e.g. by a soldering or sintering layer 6d.

In the context of the exemplary embodiment, first foil layer 8 has frame-like cutouts 19 (see FIG. 3) for connecting control connections G (Gate) of first and second power semiconductor components T1 and T2 (embodied as power semiconductor switches in the exemplary embodiment), wherein the surface segment of first foil layer 8 that is arranged in the center of the respective cutout is electrically conductively connected to control connection G of the respective power semiconductor switch via a second plated-through hole 20. The respective surface segment of first foil layer 8 that is arranged in the center of the cutout is in this way arranged in a manner electrically insulated from the rest of first foil layer 8. For the sake of clarity, only one second cutout 19 and only one plated-through hole 20 electrically conductively connected to the relevant power semiconductor switch are provided with a reference numeral in the figures.

Foil composite 11 can have, if appropriate, one or more further electrically conductive structured or unstructured foil layers, which are respectively separated from one another by a further electrically insulating foil layer. A further electrically conductive foil layer can serve e.g. for the routing of control lines.

In the context of the exemplary embodiment, first DC voltage load current connection element 14 has a base 26 running in first direction X of substrate 2, and a first section 27 running away, in particular perpendicularly away (direction Z), from substrate 26, wherein second DC voltage load current connection element 15 is mechanically connected to base 26 via foil composite 11. For this purpose, second DC voltage load current connection element 15 is electrically conductively connected to first metallic foil layer 8, by a soldering or sintering layer 7c, for example, and second metallic foil layer 10 is electrically conductively connected to base 26, by a soldering or sintering layer 7b, for example.

Second DC voltage load current connection element 15 has a first section 28 running away, in particular perpendicularly away (direction Z), from substrate 2, wherein an electrical insulation element 13 is arranged between first section 27 of first DC voltage load current connection element 14 and first section 28 of second DC voltage load current connection element 15. Insulation element 13 can be embodied as a plastic element, for example, and need not necessarily be arranged above the entire first section 27 of first DC voltage load current connection element 14 and/or above the entire first section 28 of second DC voltage load current connection element 15 between first sections 27 and 28 of first and second DC voltage load current connection elements 14 and 15. Instead of, or in addition to, insulation element 13, an electrically insulating potting 12 (e.g., composed of silicone or an epoxy resin) can also be arranged between first section 27 of first DC voltage load current connection element 14 and first section 28 of second DC voltage load current connection element 15.

Preferably, the extent AG of first and second DC voltage load current connection elements 14 and 15 and the extent AF of foil composite 11 at second DC voltage load current connection element 15 in a lateral second direction Y of substrate 2 corresponds at least to the extent AL of the first, second, third or fourth power semiconductor component in lateral second direction Y of substrate 2. Lateral second direction Y of substrate 2 preferably runs perpendicularly to lateral first direction X of substrate 2.

In order to realize screw connections for electrically conductively connecting first DC voltage load current connection element 14, second DC voltage load current connection element 15 and AC voltage load current connection element 17 to external electrical lines, first DC voltage load current connection element 14 has through-holes 16a, second DC voltage load current connection element 15 has through-holes 16b and AC voltage load current connection element 17 has through-holes 16c. In this case, through-holes 16a, 16b and 16c are respectively arranged preferably in a respective second section of the respective load current connection element, said second section running in the direction of the first direction X.

Figure 4:
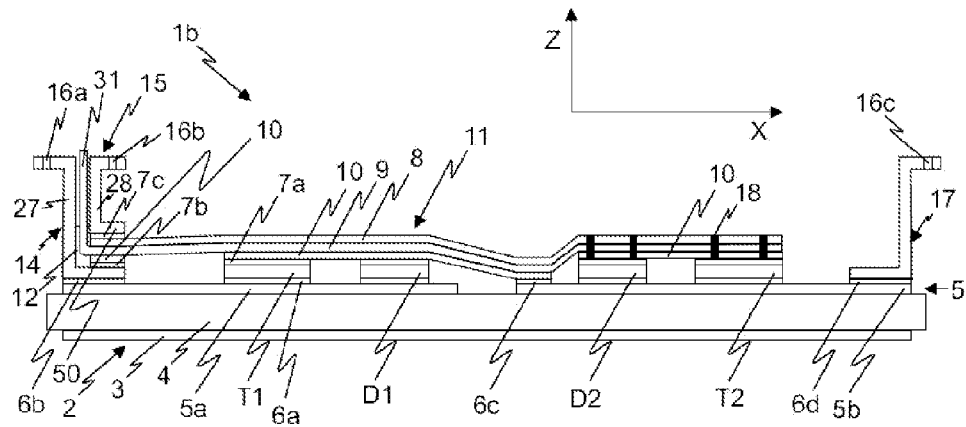
FIG. 4 shows a schematic sectional view of a further embodiment of a power semiconductor module according to the invention.

FIG. 4 illustrates a schematic sectional illustration of a further embodiment of a power semiconductor module 1b according to the invention, which corresponds to the power semiconductor module 1a according to the invention in accordance with FIG. 2 and FIG. 3 apart from the difference that the insulation element is embodied in the form of a section 31 of the electrically insulating foil layer 9.

Figure 5:
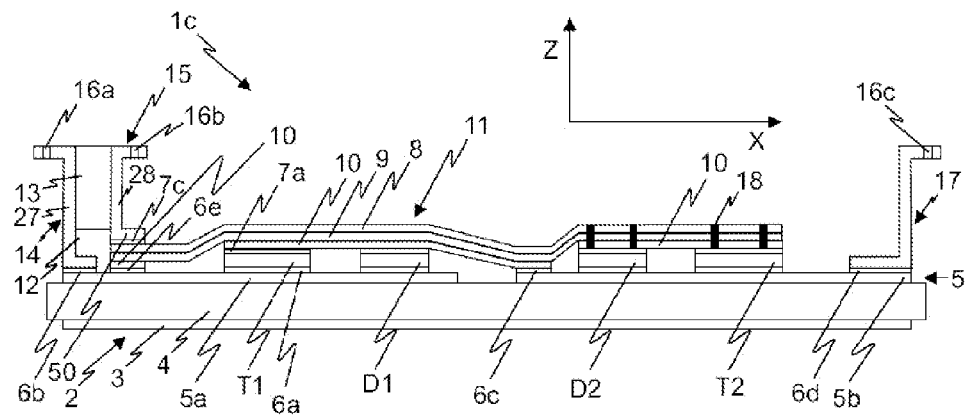
FIG. 5 shows a schematic sectional view of a still further embodiment of a power semiconductor module according to the invention.

FIG. 5 illustrates a schematic sectional illustration of a further embodiment of a power semiconductor module 1c according to the invention, which corresponds to power semiconductor module 1a according to the invention in accordance with FIG. 2 and FIG. 3 apart from the difference that second DC voltage load current connection element 15 is mechanically connected to first conductor track 5a via foil composite 11. For this purpose, the second DC voltage load current connection element 15 is electrically conductively connected to first metallic foil layer 8, by a soldering or sintering layer 7c, for example, and second metallic foil layer 10 is electrically conductively connected to first conductor track 5a, by a soldering or sintering layer 6e, for example.

Figure 6:
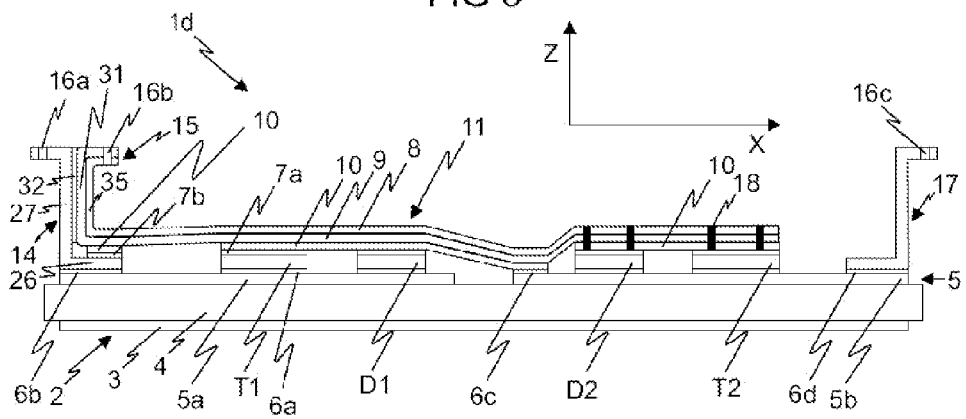
FIG. 6 shows a schematic sectional view of yet another embodiment of a power semiconductor module according to the invention.

FIG. 6 illustrates a schematic sectional illustration of a further embodiment of a power semiconductor module 1d according to the invention, which corresponds to the power semiconductor module 1a according to the invention in accordance with FIG. 2 and FIG. 3 apart from the difference that the second DC voltage load current connection element 15 is embodied in the form of a section 35 of first metallic foil layer 8 and second DC voltage load current connection element 15 is electrically conductively connected to first metallic foil layer 8 by virtue of second DC voltage load current connection element 15 being embodied integrally with first metallic foil layer 8, wherein a section 31 of electrically insulating foil layer 9 is arranged between first section 27 of first DC voltage load current connection element 14 and second DC voltage load current connection element 15. In this case, section 31 of electrically insulating foil layer 9 is preferably arranged at first section 27 of first DC voltage load current connection element 14. Preferably, in this case, section 31 of electrically insulating foil layer 9 is connected to first section 27 of first DC voltage load current connection element 14, by an adhesive layer 32, for example. Furthermore, preferably, second metallic foil layer 10 is electrically conductively connected to base 26 of first DC voltage load current connection element 14, by a soldering or sintering layer 7b, for example. Alternatively or additionally, second metallic foil layer 10 can be electrically conductively connected to first conductor track 5a, by a soldering or sintering layer 6e, for example, analogously to the exemplary embodiment in accordance with FIG. 5.

Figure 7:
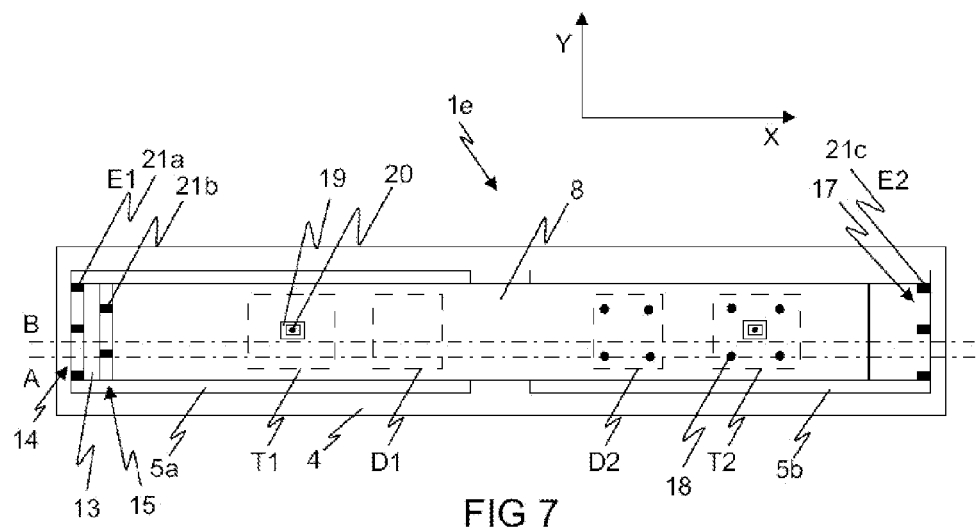
FIG. 7 shows a top view from above of a further embodiment of a power semiconductor module according to the invention.

FIG. 7 illustrates a schematic sectional illustration of a further embodiment of a power semiconductor module 1e according to the invention, which corresponds to the power semiconductor module 1a according to the invention in accordance with FIG. 2 and FIG. 3 apart from the difference that the first DC voltage load current connection element 14 has first pins 21a running away from substrate 2, in particular perpendicularly away from the substrate 2, and second DC voltage load current connection element 15 has second pins 21b running away from substrate 2, in particular perpendicularly away from substrate 2, wherein second pins 21b, in relation to the first pins 21a, in lateral second direction Y of substrate 2, preferably in order to increase the electrical insulation strength, are arranged in a manner offset with respect to one another. For the sake of clarity, only one first pin 21a and one second pin 21b are provided with a reference sign in FIG. 7. Preferably, the AC voltage load current connection element 17 has third pins 21c running away from substrate 2, in particular perpendicularly away from substrate 2, wherein only one third pin 21c is provided with a reference sign in FIG. 7, for the sake of clarity.

Figure 8:
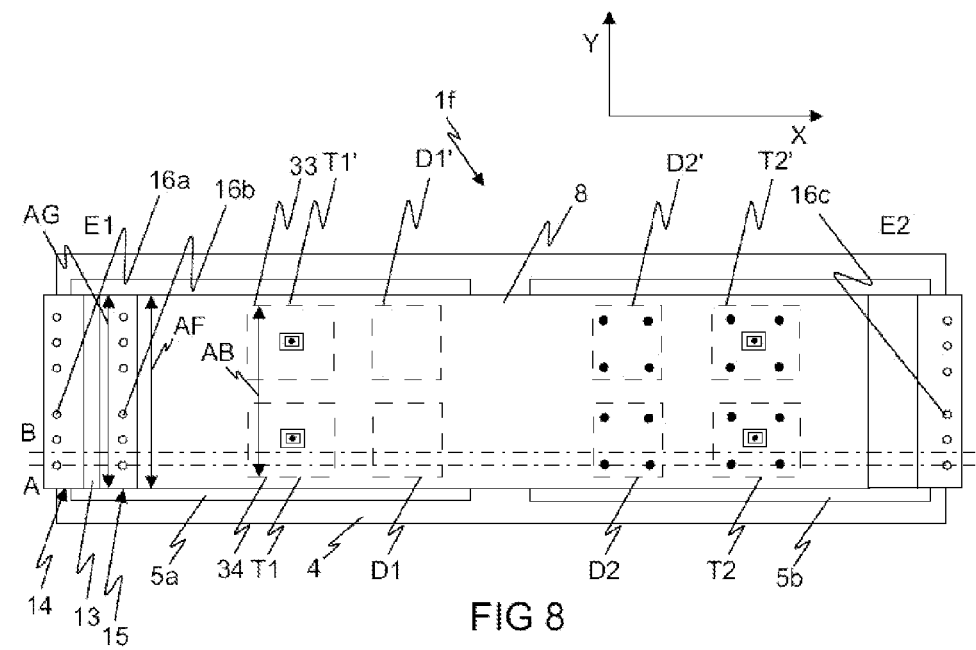
FIG. 8 shows a view from above of a still further embodiment of a power semiconductor module according to the invention.

In particular in order to increase the current-carrying capacity of the power semiconductor module according to the invention, one or more further power semiconductor components of respectively identical type can respectively also be electrically connected in parallel with one or more power semiconductor components and be arranged on substrate 2. FIG. 8 illustrates a top view of an exemplary embodiment of such a further embodiment of a power semiconductor module 1f according to the invention, in which a further first power semiconductor component T1' is electrically connected in parallel with first power semiconductor component T1, by foil composite 11 and first conductor track 5a, and in which a further second power semiconductor component T2' is electrically connected in parallel with second power semiconductor component T2, by foil composite 11 and second conductor track 5b, and in which a further third power semiconductor component D1' is electrically connected in parallel with third power semiconductor component D1, by foil composite 11 and first conductor track 5a, and in which a further fourth power semiconductor component D2' is electrically connected in parallel with the fourth power semiconductor component D2, by foil composite 11 and second conductor track 5b. In this case, the power semiconductor components respectively electrically connected in parallel with one another are of identical type, that is to say that if, e.g., first power semiconductor component T1 is a power semiconductor switch, then the first further power semiconductor component T1' is likewise a power semiconductor switch, and if, e.g., third power semiconductor component D1 is a diode, then the third further power semiconductor component D1' is likewise a diode.

The extent AG of first and second DC voltage load current connection elements 14 and 15 and the extent AF of foil composite 11 at second DC voltage load current connection element 15 in lateral second direction Y of substrate 2 corresponds at least to the distance AB, in lateral second direction Y of substrate 2, between the outer edges 33 and 34 furthest away from one another of the corresponding power semiconductor component T1, T2, D1 or D2 and the further power semiconductor component T1', T2', D1' or D2' of identical type that is electrically connected in parallel therewith.

Otherwise, the exemplary embodiment in accordance with FIG. 8 corresponds to the exemplary embodiment in accordance with FIG. 2 and FIG. 3, wherein the exemplary embodiment in accordance with FIG. 8 can also be combined with all other exemplary embodiments.

It should furthermore be noted that, the expression that two elements are "electrically conductively connected" (as used herein) is understood to include both a direct electrically conductive connection of two elements, by e.g. a welding, soldering or sintering connection between the two elements, and also an indirect electrically conductive connection by e.g. one or more conduction elements, conduction layers and/or plated-through holes that electrically connect the two elements to one another, such that a bi-directional electrical current flow is possible between the two elements that are "electrically conductively connected" to one another. In the case of a sintering connection, in particular, besides the sintering layer one or more adhesion promoting layers (e.g., composed of a noble metal, in particular composed of silver) can also be arranged between the two elements which are electrically conductively connected to one another and be arranged at one of the two or at both elements which are electrically conductively connected to one another.

Preferably, first and second DC voltage load current connection elements 14 and 15 are arranged on substrate 2 in a first end region E1 of substrate 2.

Also preferably, AC voltage load current connection element 17 is arranged on substrate 2 in a second end region E2 of substrate 2, wherein the first, second, third and fourth power semiconductor components are arranged on substrate 2 between first and second end regions E1 and E2.

It is also, preferred that the thickness of first sections 27 and 28 of first and second DC voltage load current connection elements 14 and 15 that runs in the direction of first direction X is small relative to the extent AG of first and second DC voltage load current connection elements 14 and 15. First sections 27 and 28 of first and second DC voltage load current connection elements 14 and 15 are preferably flat.

Furthermore, the third and fourth power semiconductor components can be omitted in the exemplary embodiments as a matter of design choice.

In the exemplary embodiments, first and second DC voltage load current connection elements 14 and 15 are arranged along lateral first direction X of substrate 2, and first and second DC voltage load current connection elements 14 and 15 are arranged one behind the other along lateral first direction X of substrate 2, wherein first and second power semiconductor components T1 and T2 are arranged along lateral first direction X of substrate 2 on a common side SE in relation to first and second DC voltage load current connection elements 14 and 15. This need not necessarily be the case, however. In a generalized way it suffices if, in the case of the invention, first and second DC voltage load current connection elements 14 and 15 are arranged one behind the other, wherein first and second power semiconductor components T1 and T2 are arranged on a common side SE in relation to first and second DC voltage load current connection elements 14 and 15. First and second DC voltage load current connection elements 14 and 15 can thus also be arranged in a manner rotated by, e.g., 90° on the substrate 2, e.g., in FIG. 3, FIG. 7 and FIG. 8 (axis of rotation runs perpendicularly through substrate 2). Furthermore, first and second DC voltage load current connection elements 14 and 15 can also be arranged above or below first power semiconductor component T1 and/or the third power semiconductor component D1, e.g., in relation to the illustration in accordance with FIG. 3, FIG. 7 and FIG. 8.

As in the exemplary embodiments, preferably, second DC voltage load current connection element 15 likewise has a base 50, wherein second DC voltage load current connection element 15 is mechanically connected to base 26 of first DC voltage load current connection element via foil composite 11 by virtue of base 50 being mechanically connected to base 26 via foil composite 11, or second DC voltage load current connection element 15 is mechanically connected to first conductor track 5a via foil composite 11 by virtue of base 50 being mechanically connected to the first conductor track 5a via foil composite 11.

Furthermore, it should be noted that an electrical insulation device is arranged between second DC voltage load current connection element 15 and electrically conductive structured conduction layer 5, such electrical insulation device preferably being present in the form of a section of insulating foil layer 9 of foil composite 11. Second DC voltage load current connection element 15 is electrically insulated from electrically conductive structured conduction layer 5 by this electrical insulation device.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:
1. A power semiconductor module comprising:
a substrate having an insulating material body and an electrically conductive structured conduction layer arranged on said insulating material body, said conduction layer forming conductor tracks which are electrically insulated from one another, said substrate defining a lateral first direction;
wherein a first power semiconductor component having a first and a second load current connection is arranged on a first conductor track and said first load current connection of said first power semiconductor component is electrically conductively connected to said first conductor track;
wherein a second power semiconductor component having a first and a second load current connection is arranged on a second conductor track and said first load current connection of said second power semiconductor component is electrically conductively connected to said second conductor track;
wherein the power semiconductor module has a first and a second DC voltage load current connection element; and
wherein said first and second power semiconductor components are arranged along said lateral first direction of said substrate and said first and second DC voltage load current connection elements are arranged one behind the other;
the power semiconductor module further comprising:
a foil composite having a first metallic foil layer and a structured second metallic foil layer and an electrically insulating foil layer arranged between said first and second metallic foil layers;
wherein said second load current connection of said first power semiconductor component is electrically conductively connected to said second metallic foil layer and said second metallic foil layer is electrically conductively connected to said second conductor track;

wherein said second load current connection of said second power semiconductor component is electrically conductively connected to said first metallic foil layer;

wherein said first DC voltage load current connection element is electrically conductively connected to said first conductor track and said second DC voltage load current connection element is electrically conductively connected to said first metallic foil layer; and wherein said first and second power semiconductor components are arranged on a common side in relation to said first and second DC voltage load current connection elements.

2. The power semiconductor module of claim 1,
wherein said first and second DC voltage load current connection elements are arranged along said lateral first direction of said substrate and said first and second DC voltage load current connection elements are arranged one behind the other along said first direction of said substrate;

wherein said first and second power semiconductor components are arranged along said first direction of said substrate on a common side in relation to said first and second DC voltage load current connection elements.

3. The power semiconductor module of claim 1, wherein said first and second power semiconductor components are power semiconductor switches.

4. The power semiconductor module of claim 1, wherein a third power semiconductor component having a first and a second load current connection is arranged on said first conductor track and said first load current connection of said third power semiconductor component is electrically conductively connected to said first conductor track;

wherein a fourth power semiconductor component having a first and a second load current connection is arranged on said second conductor track and said first load current connection of said fourth power semiconductor component is electrically conductively connected to said second conductor track;

wherein said third and fourth power semiconductor components are arranged along said first direction of said substrate;

wherein said second load current connection of said third power semiconductor component is electrically conductively connected to said second metallic foil layer;

wherein said second load current connection of said fourth power semiconductor component is electrically conductively connected to said first metallic foil layer; and wherein said first, second, third and fourth power semiconductor components are arranged on a common side in relation to said first and second DC voltage load current connection elements.

5. The power semiconductor module of claim 4, wherein said first, second, third and fourth power semiconductor components are arranged along said first direction of said substrate on a common side in relation to said first and second DC voltage load current connection elements.

6. The power semiconductor module of claim 4, wherein said third and fourth power semiconductor components are diodes.

7. The power semiconductor module of claim 1,
wherein said first DC voltage load current connection element has a base and a first section running away from said substrate; and wherein said second DC voltage load current connection element is mechanically connected to said base of said first DC voltage load current connection element via said foil composite.

8. The power semiconductor module of claim 1,
wherein said first DC voltage load current connection element has a first section running away from said substrate; and wherein said second DC voltage load current connection element is mechanically connected to said first conductor track via said foil composite.

9. The power semiconductor module of claim 1,
wherein said second DC voltage load current connection element has a first section which runs away from said substrate;

the power semiconductor module further comprising an electrical insulation element arranged between said first section of said first DC voltage load current connection element and said first section of said second DC voltage load current connection element.

10. The power semiconductor module of claim 9, wherein said insulation element is embodied in the form of a section of said electrically insulating foil layer.

11. The power semiconductor module of claim 1,
wherein said first DC voltage load current connection element has first pins running away from said substrate and said second DC voltage load current connection element has second pins running away from said substrate; and wherein said second pins, in relation to said first pins of said substrate, are arranged in a manner opposite with respect to one another.

12. The power semiconductor module of claim 1,
wherein said second DC voltage load current connection element is embodied in the form of a section of said first metallic foil layer and said second DC voltage load current connection element is electrically conductively connected to said first metallic foil layer by said second DC voltage load current connection element being embodied integrally with said first metallic foil layer; and wherein a section of said electrically insulating foil layer is arranged between said first section of said first DC voltage load current connection element and said second DC voltage load current connection element.

13. The power semiconductor module of claim 1, wherein said first and second DC voltage load current connection elements and said first and second power semiconductor components are arranged on a line on said substrate and said line runs in said first direction.

14. The power semiconductor module of claim 1, wherein the extent of said first and second DC voltage load current connection elements and the extent of said foil composite at said second DC voltage load current connection element corresponds at least to said extent of one of said first and said second power semiconductor components.

15. The power semiconductor module of claim 4, wherein the extent of said first and second DC voltage load current connection elements and the extent of said foil composite at said second DC voltage load current connection element corresponds at least to said extent of at least one of said third and said fourth power semiconductor components.

16. The power semiconductor module of claim 1,
wherein a further power semiconductor component of identical type is electrically connected in parallel at least with one of the power semiconductor components and arranged on said substrate; and wherein the extent of said first and second DC voltage load current connection elements and the extent of said foil composite at said second DC voltage load current connection element correspond at least to the distance between the outer edges furthest away from one another of the corresponding power semiconductor component and of the further power semiconductor component of identical type that is electrically connected in parallel therewith.

\* \* \* \* \*